(12) United States Patent
Dabrowiecki et al.

(10) Patent No.: US 8,664,969 B2
(45) Date of Patent: Mar. 4, 2014

(54) METHODS AND APPARATUS FOR IMPLEMENTING ELECTRICAL CONNECTIVITY FOR ELECTRONIC CIRCUIT TESTING

(75) Inventors: Krzysztof Dabrowiecki, Fremont, CA (US); Scott Clegg, Scottsdale, AZ (US)

(73) Assignee: Probelogic, Inc., San Jose, CA (US)

( * ) Notice: Subject to any disclaimer, the term of this patent is extended or adjusted under 35 U.S.C. 154(b) by 527 days.

(21) Appl. No.: 12/879,990

(22) Filed: Sep. 10, 2010

(65) Prior Publication Data
US 2011/0068815 A1 Mar. 24, 2011

Related U.S. Application Data

(60) Provisional application No. 61/241,634, filed on Sep. 11, 2009.

(51) Int. Cl.
*G01R 31/20* (2006.01)
(52) U.S. Cl.
USPC .................................. 324/754.03
(58) Field of Classification Search
USPC ............. 324/754.01–754.3, 762.01–762.1; 257/48; 438/14–18
See application file for complete search history.

(56) References Cited

U.S. PATENT DOCUMENTS

| | | | |
|---|---|---|---|
| 5,644,249 A | 7/1997 | Kister | |
| 5,751,157 A | 5/1998 | Kister | |
| 6,998,858 B2 * | 2/2006 | Sawada et al. | 324/750.22 |
| 7,119,561 B2 | 10/2006 | Sato | |
| 7,282,936 B2 * | 10/2007 | Brandorff | 324/750.25 |

* cited by examiner

*Primary Examiner* — Tung X Nguyen
(74) *Attorney, Agent, or Firm* — Vista IP Law Group, LLP

(57) ABSTRACT

Various embodiments are directed at an apparatus for implementing electrical connectivity for testing of a semiconductor device. The apparatus comprises a probe head which comprises an upper guide plate and a lower guide plate, wherein the upper guide plate defines a plurality of first apertures, and the lower guide plate defines a plurality of second apertures in some embodiments. The apparatus further comprises a plurality of probes, wherein each of the plurality of probes passes through one of the plurality of first apertures on the upper guide plate and one of the plurality of second apertures on the lower guide plate, and at least one of the plurality of probes defines a buckled form after the at least one of the plurality of probes is finally assembled in the apparatus. The apparatus further comprises a template member to guide the plurality of probes.

30 Claims, 10 Drawing Sheets

METHODS AND APPARATUS FOR IMPLEMENTING ELECTRICAL CONNECTIVITY FOR ELECTRONIC CIRCUIT TESTING

CROSS REFERENCE TO RELATED APPLICATION(S)

This application claims the benefit of U.S. Prov. App. Ser. No. 61/241,634, filed Sep. 11, 2009 and entitled "METHODS AND APPARATUS FOR IMPLEMENTING ELECTRICAL CONNECTIVITY FOR ELECTRONIC CIRCUIT TESTING", the contents of which are hereby incorporated by reference in their entirety.

FIELD OF INVENTION

Various embodiments of the invention relate to a method and an apparatus for implementing electrical connectivity for electronic circuit testing.

BACKGROUND

Testing a semiconductor devices has been proven to be crucial to ensure the efficient manufacturing of the semiconductor devices. Testing semiconductor devices before these semiconductor devices are individually cut and mounted in semiconductor device packages, such as an integrated circuit (IC) packaging, has shown even more advantages of saving additional cost and time for further processing the semiconductor devices or cutting and mounting these devices in semiconductor device packages.

Probe cards or similar testing devices are frequently used in testing the semiconductor devices under test. A probe card constitutes an interface between the semiconductor device under test and the testing equipment such as a metrology tool. One of the functions of a probe card is to provide electrical connectivity between the numerous bond pads and the corresponding electrical contacts of a printed circuit board (PCB), which may be external or internal to the probe card, to transmit and receive signals for testing of the semiconductor device under test.

Due to the different design and/or manufacturing requirements, the pitch or spacing between one bond pad and an adjacent bond pad is quite different from that between one electrical contact and an adjacent electrical contact on the printed circuit board. For example, in modern semiconductor devices, a typical pitch for the bond pads may be 50 to 100 μm, whereas a typical pitch between one electrical contact to an adjacent contact on a printed circuit board may be 0.5 to 1.0 mm. Due to various reasons such as alignment, manufacturability, or cost effectiveness of the probe card, probe cards often comprise an interposer which acts as an interface or an interconnect among the various bond pads with a much finer pitch on the device side and a different, often coarser, pitch among various electrical contacts on the PCB side. That is, each of these probe cards comprises an interposer or at least a substrate that acts as an interposer to interface between the semiconductor device under test and the PCB so as to ensure the proper test signals are transmitted and received from the corresponding bond pads on the semiconductor device under test.

Semiconductor devices usually exhibit a thin layer of thin oxides on the outer surfaces of some metal components due to, for example, exposure to non-inert gases such as air or other reactive gases or due to some passivation processes. The formation of such a thin layer of oxides may negatively affect the connectivity between the semiconductor device under test and thus impedes the transmission of the test signals to and from the metrology equipment.

One school of thought in terms of probe card design or the probe design is that the probe is designed to exhibit certain lateral movement during overdrive such that the tip of the probe scrubs against the bond pad laterally to break up the oxide layer. It shall be noted that the distance or the action of moving or driving the probes towards the bond pads is referred to as the "overdrive". The theory behind this school of thought is that the electrical connectivity may be improved because the oxide layer is broken up due to the scrubbing by the lateral movement of the probe tip so as to ensure better contact between the probe and its corresponding pad.

A typical approach for inducing such a scrubbing action is to secure the probe in a cantilever fashion as illustrated in FIG. 1 which illustrates an exaggerated view of a probe before and after the probe is driven to make contact with its corresponding bond pad. In FIG. 1, the probe 102 represents a testing probe before it is driven to make contact with the bond pad 106. The probe 102 is fixedly secured on one end at the upper right hand corner and acts like a cantilever when the probe is subject to a force and may deflect upwards and downwards in the Y-direction (the vertical direction.) The probe tip 112 is free to move and is responsible for making contact with the bond pad 106. After the probe is driven by the overdrive 110 to make contact with the bond pad 106, the probe deflects as shown by 104. It can be seen that probe 104 then exhibits some lateral movement as illustrated by 108 and such a lateral movement causes the probe tip 112 to scrub against the surface of the bond pad 106.

This approach, however, causes undesired particle issues because the probe tips break the oxide layer near the semiconductor devices, where the broken oxides may end up on the semiconductor devices. These particle issues are even more severe when the testing is conducted on uncut and unmounted semiconductor devices because the broken oxides are on the device side of the wafer. In addition, there may exist further issues with the alignment between a probe and its corresponding bond pad due to the lateral motion of the probe tip. In other words, such an intended lateral motion of the probe tip further exacerbates the alignment issues, especially for semiconductor devices with high density bond pads.

Furthermore, modern semiconductor devices with high density bond pads further introduces another category of issues and challenges to testing devices such as probe cards described above. With the continual shrinkage of feature sizes and die sizes, the pitch of the bond pads has become smaller, and thus the spacing of the probes and interconnects between the probes and the PCB have also become smaller as a result. The ever decreasing spacing and pitch cause new challenges to properly insulate various interconnects, probes, or electrical contacts and/or to prevent cross-talk among nearby interconnects, probes, or electrical contacts. Probe card designs have been adapted to utilize components, such as the probes, of smaller sizes in order to accommodate this ever decreasing feature size in modern semiconductor devices. Nonetheless, the use of smaller size components has created new challenges in manufacturability of the probe cards and their internal modules and also in the reliability and robustness of the probe cards due to their small size components.

With the continued trend to shrink the feature size and the die size and the never ending push for higher operating frequencies and lower manufacturing costs, modern semiconductor device designers and manufacturers have been trying to reduce the size of the features so as to squeeze more features into a single, yet smaller die in order to produce more chips per wafer. For example, a 50 μm interconnect may be considered "small" a few years ago, but the pitch between two bond pads may be a mere 50 μm or less in some modern integrated circuits. Therefore, it is not uncommon for a modern integrated circuit chip to have thousands, tens of thousands, or even more bond pads in one chip. This continual shrinkage in feature sizes has made the design and manufacturing of the probe cards even more challenging, especially for the probe cards with interposers. FIG. 2 illustrates a typical interposer which comprises a substrate 204 and situates between a PCB 202 and a plurality of probes 208. The probe 208 makes electrical contact with the interposer at 210, and the interposer is electrically or operatively connected to the PCB 202 at 212.

In addition, modern testing devices such as the probe cards described above use multiple segments for the probe design. FIG. 10 illustrates a typical multi-segment probe design in which the ends 1002 and 1004 of the probe are made of smaller size components or materials than the main body of the probe 1006. The ends 1002 and 1004 are then bonded or connected to the main body 306 to form the probe. In other multi-segment probe designs, the ends of the probe may be made of larger size components or materials as a design choice.

SUMMARY

What is needed is a method and an apparatus for implementing electrical connectivity for electronic circuit testing. In a single embodiment or in some embodiments, the apparatus for implementing electrical connectivity for electronic circuit testing comprises a probe head and a plurality of probes. In these embodiments, the probe head comprises an upper die, which is used to secure the upper portions of the probes and/or to provide the provisions to align the probe head to the printed circuit board, and a lower die, which provides the provisions to position or form the probes and/or to align the probe head/the probe card to the semiconductor device under test.

In the single or in some other embodiments, the apparatus further comprises a template, which is used to ensure prevent one probe from contacting another probe or to prevent crosstalk between two of the plurality of probes by ensuring proper spacing between the plurality of probes. In the single embodiment or in some embodiments, the template is adapted to form the plurality of probes.

In the single embodiment or in some embodiments, the probe assumes a buckled shape. It shall be noted that in various embodiments, the term "buckled form" is used to describe the profile of a portion of a probe along the vertical direction after the probe is finally assembled in the apparatus and refers to the fact that the probe is subject to certain compression stress at least along a section of the vertical portion of the probe when the probe is driven to make contact with its corresponding bond pad on the semiconductor device under test. Nonetheless, the use of the term "buckled" does not necessarily mean that the probe actually exhibits a failure mode as commonly understood in buckling. That is, although a portion of the probe deflects or deforms to exhibit a similar form as in the actual buckling of a structural member, the use of the term "buckled form" does not necessarily suggest that the probe is actually subject to a compressive stress at or beyond the point of failure.

Some other embodiments are directed at the use of the apparatus for implementing electrical connectivity for electronic circuit testing. More details about the apparatus or the method for implementing electrical connectivity for electronic circuit testing will be described in the following paragraphs.

BRIEF DESCRIPTION OF THE FIGURES

The drawings illustrate the design and utility of preferred embodiments of the present invention. It should be noted that the figures are not drawn to scale and that elements of similar structures or functions are represented by like reference numerals throughout the figures. In order to better appreciate how the above-recited and other advantages and objects of the present inventions are obtained, a more particular description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Various embodiments of the invention which are directed to a method or an apparatus for electronic circuit testing. In various embodiments, the term "the method or the apparatus" is used throughout this application and refers to one or more processes or acts of the method for electronic circuit testing or one or more hardware modules or components for electronic circuit testing.

Figure 1:
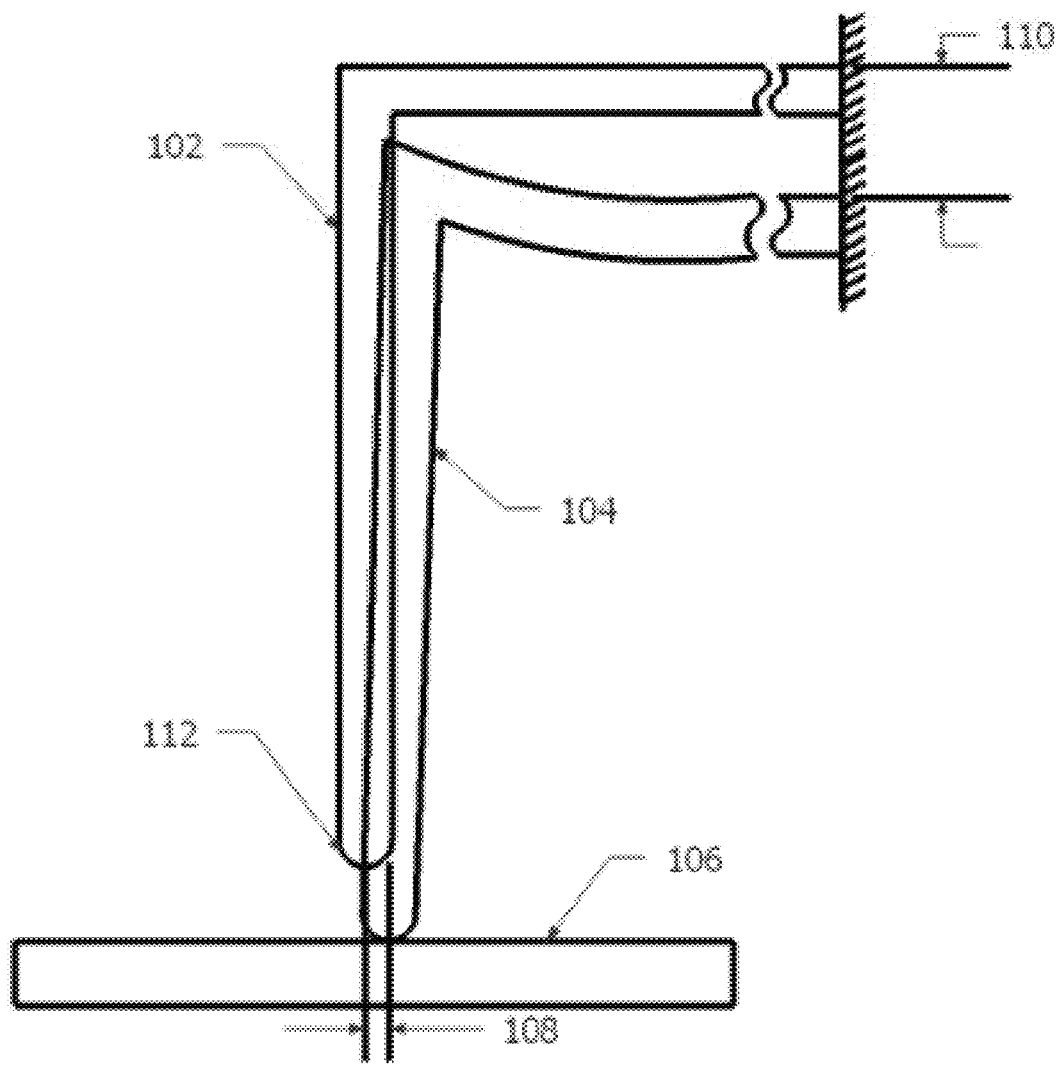
FIG. 1 illustrates an exaggerated view of a probe before and after the probe is driven to make contact with its corresponding bond pad.
Figure 2:
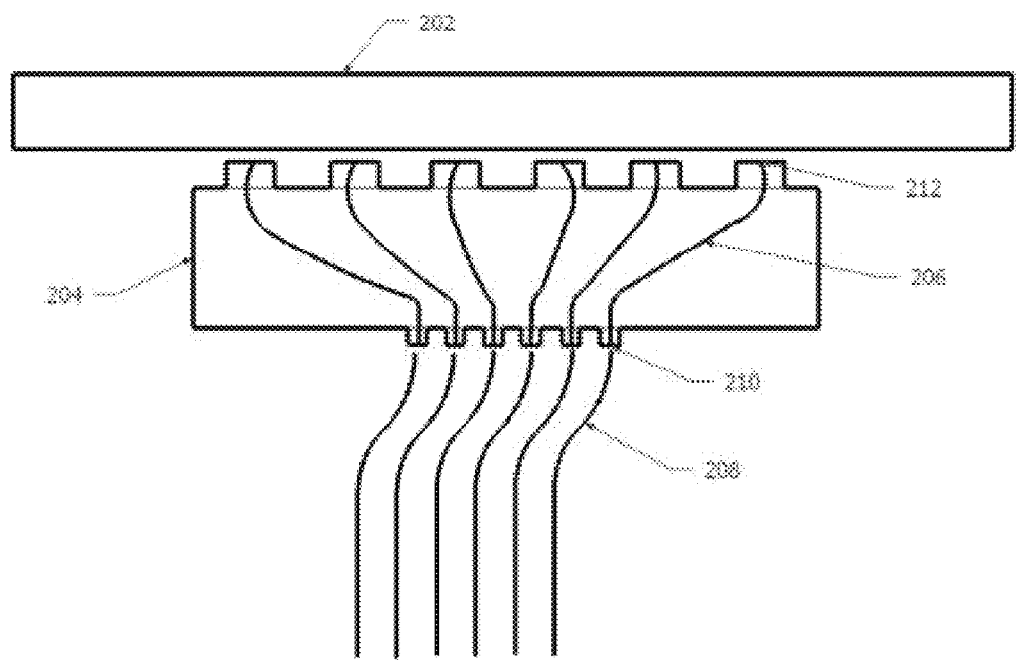
FIG. 2 illustrates a typical interposer.
Figure 3A:
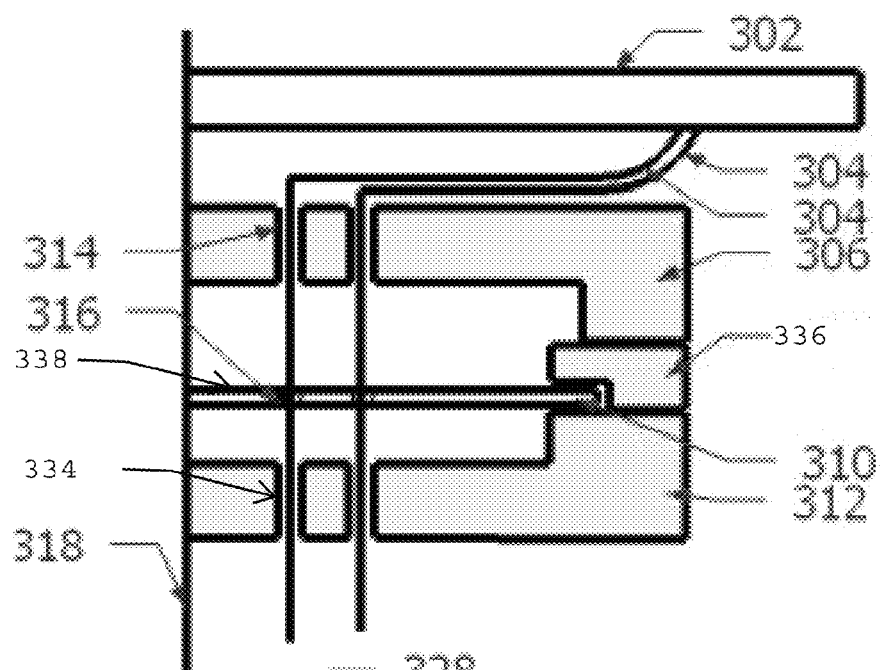
FIG. 3A-B one half of a sectional view of an apparatus for implementing electrical connectivity for electronic circuit testing in some embodiments.

Referring to FIG. 3A which illustrates one half of a sectional view of an apparatus for implementing electrical connectivity for electronic circuit testing in some embodiments. In a single embodiment or in some embodiments, the apparatus for implementing electrical connectivity for electronic circuit testing comprises a probe head assembly and a plurality of probes 304. In the single embodiment or in these embodiments, the probe head assembly comprises an upper die 306 and a lower die 312.

In the single embodiment or in these embodiments, the upper die 306 comprises a plurality of first apertures 314 which are configured to allow the probes 304 to pass through, and the lower die 312 also comprises a plurality of second apertures 334 which allow the probes 304 to pass through. In the single embodiment or in some embodiments, the plurality of second apertures 334 are configured to match the patter of bond pads on the semiconductor device under test and/or to align the apparatus and/or the assembled probes to align with the corresponding bond pads on the semiconductor device under test.

In the single embodiment or in some embodiments, the body of the upper die 306 and/or the lower die 312 is made of an electrically insulating material. In one embodiment, the electrically insulating material for the body of the upper die 306 or the lower die 312 comprises a fire rated electrical-grade, dielectric fiberglass laminate epoxy resin, such as a G10-FR4. In the single embodiment or in some embodiments, the material for the body is chosen to meet one or more criteria concerning chemical resistance, one or more electrical properties under dry and humid conditions, one or more physical properties such as flexural, impact, or other mechanical strength, or bond strength, temperature rating, flame rating, reactiveness at high frequencies, or moisture absorption or permeation properties, etc.

In the single embodiment or in some embodiments, the apparatus further comprises a template 338 which is situated between the upper die 306 and the lower die 312. In the single embodiment or in some embodiments, the template 338 comprises a sheet of electrically insulating material with a plurality of third apertures for the probes to pass through such that the probes are separated from each other at a predetermined distance. In the single embodiment or in some embodiments, the predetermined distance is to prevent one probe from contacting another nearby or adjacent probe.

In the single embodiment or in some embodiments, the spacer is configured and adapted such that the probes need not be individually coated with insulating materials because the template 338 constrains the range of deflection or motion of the probes such that the probes will not come in contact or within a threshold distance so as to cause cross-talk noise between nearby or adjacent probes which the probes are carrying testing signals. In one embodiment, the electrically insulating material for the body of the template 338 comprises Dura-Lar™, Mylar®, or Meline®.

In some other embodiments, other materials may be selected based at least in part upon one or more criteria concerning mechanical strength, chemical stability, dimensional stability, transparency, translucency, reflectivity, gas and aroma barrier properties, or electrical insulation properties, etc. For example, polyester sheets or other plastic sheets may also be selected for the body of the template 338. In the single embodiment or in some embodiments, the material for the body of the template 338 may be chosen in a way to allow a person with aided or unaided eyesight to see through the template 338. For example, a transparent or translucent material may be chosen for the body of the template 338 so a person with aided or unaided eyesight to see through the template 338 during the assembly or manufacturing of the probe head assembly or the apparatus.

In the single embodiment or in some embodiments, metal or metallic materials may also be selected for the body of the template 338. In this single embodiment or in these embodiments, each probe needs to be individually insulated. In one embodiment, each probe may be individually, electrically insulated by forming a thin film of plastic enclosure along or near the outer surface of the probe by, for example, a plastic coating process such as a powder coating process. In some other embodiments, each probe needs not be individually, electrically insulated from other probes. In these embodiments, the template 338 may be configured to comprise electrically insulating inserts for the plurality of third apertures on the template 338. These electrically insulating inserts are to be fixedly secured on the template 338 to ensure the bare, uninsulated metal probes do not contact the metal or metallic template 338. Each of the electrically insulating insert comprises an aperture for a probe to pass through.

In the single embodiment or in some embodiments, the template 338 is not connected, attached, or secured by any means to the probe head. That is, in the single embodiment or in these embodiments, the template 338 is floating between the upper die and the lower die and is supported by the probes. In other embodiments, the template 338 may be connected, attached, or secured to any part of the probe head assembly. For example, the template 338 may be secured to the upper die 306, the lower die 312, the spacer 336, or other components.

In the single embodiment or in some embodiments, the spacer 336 is configured to define a recessed pocket which constrains the range of movement of the template 338. In the single embodiment or in some embodiments, the spacer 336 comprises an individual component which is separate from the upper die 306 or the lower die 312. In other embodiments, the spacer 336 may be attached to other components such as the upper die 306 or the lower die 312 in the probe head assembly by means of bonding, gluing, brazing, welding, or other means with the use of fasteners. In some other embodiments, the spacer 336 may be a part of other components of the probe head assembly. For example, the upper die 306 or the lower die 312 may be configured and adapted to accommodate all the needed or desired features of the spacer such that these needed or desired features may be manufactured in the upper die or the lower die in one piece.

In the single embodiment or in some embodiments, the probe head assembly is assembled by running each of the probes 304 through its corresponding first aperture 314 on the upper die 306 and through the corresponding third aperture 316 on the template 338 and the corresponding second aperture 334 on the lower die 312. The order of assembly may not be significant in some embodiments and may be changed freely. In some embodiments, where the probes are first run through the template 338 before the probes are run through the lower die 312 or the upper die 306, the assembler may need to see, with aided or unaided eyesight, the corresponding aperture underneath the template. In these embodiments, a transparent or translucent material may be selected for the template 338 such that the assembler is allowed to see through the template for the ease of assembly or manufacturing of the apparatus. In the single embodiment or in some embodiments, the probes 304 are attached to a printed circuit board 302.

Figure 3B:
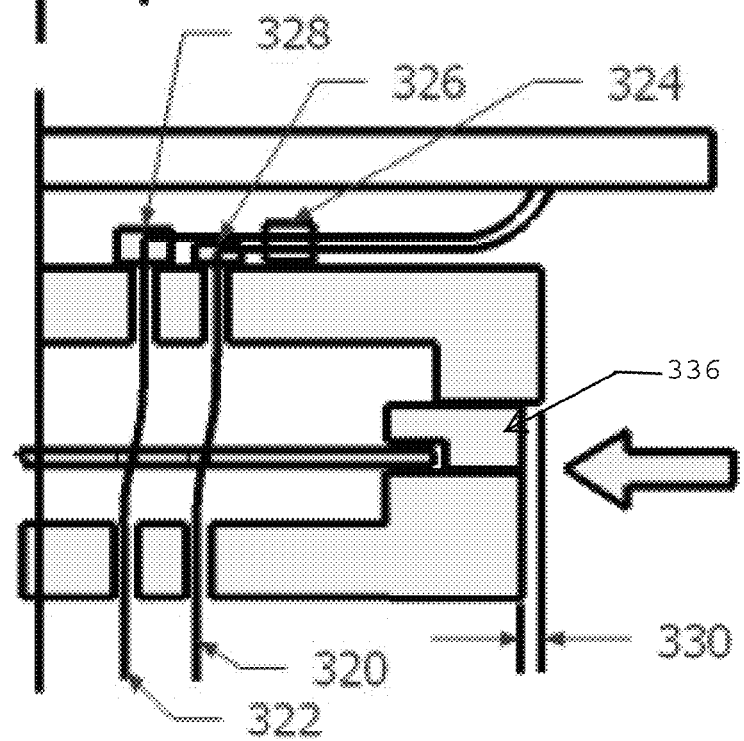

FIG. 3B further illustrates more details of the probe head assembly for the apparatus for implementing electrical connectivity for electronic circuit testing. In the single embodiment or in some embodiments, each of the probes 304 comprises a straight, vertical portion with one end (the probe tip) to contact the respective bond pad on the semiconductor device under test. The probes 304 may be installed through the upper die 306, the template 338, and the lower die 312 while maintaining a straight, vertical portion.

Then the lower die 312 and/or the spacer 336 may be offset by a predetermined distance 330 relative to the upper die to induce a buckled form for each of the probes. This buckled form of each of the probes may be used to support a free floating template 338 in the single embodiment or in some embodiments. This buckled form is also configured based at least in part upon the material properties of the probes, the geometric attributes of the probes, and/or the predetermined offset distance 330. The material properties may comprise, in some embodiments, the mechanical strength such as yield strength, flexural strength, etc., hardness of the material, physical and electrical properties such as the electrical resistivity, thermal conductivity, thermal expansion coefficient, etc. The geometric properties comprise size of the probes such as diameter, cross-sectional area, length of each portion, etc.

In the single embodiment or in some embodiments, the vertical positioning of the template and/or the spacer is configured or adapted to allow a first mode of buckled form. In the single embodiment or in some embodiments, the vertical positioning of the template and/or the spacer is configured or adapted to allow a second mode of buckled form. In the single embodiment or in some embodiments, the vertical positioning of the template and/or the spacer is configured or adapted to allow other modes of buckled form.

In the single embodiment or in some embodiments, the predetermined offset 332 is configured or adapted to allow a first mode, a second mode, or other modes of buckled forms. In the single embodiment or in some embodiments, the predetermined offset 332 is configured or adapted to cause a portion of the vertical portion of each probe to exhibit a buckled for so as to support a free floating template.

In the single embodiment or in some embodiments, the predetermined offset 332 may be achieved by defining one or more elongated apertures on the spacer 336 or the lower die 312. These elongated apertures have a longer axis in the direction of the offset than other direction(s). These elongated apertures allow the vertical portion of the probes 304 to remain straight during the initial assembly and also allows the spacer 336 or the lower die 312 to be offset by a predetermined offset 332 to cause the buckled forms for the probes 304. Other means may also be used to allow the offset 332 between the upper die and the offset component. For example, one or more locating pins or alignment pins may be used for the position before offset and also for the position after offset.

In FIG. 3B, a portion of the vertical portion of each probe, 320 and 322, remains straight. This illustrates that the probes 304 have not made contact with the corresponding bond pads on the semiconductor device under test. In some embodiments where extruded wires with one or two micro meter diameter is used for the making of the probes, an offset of 0.005" to 0.010" has been shown to produce the buckled form to meet the requirements of the apparatus.

Figure 4:
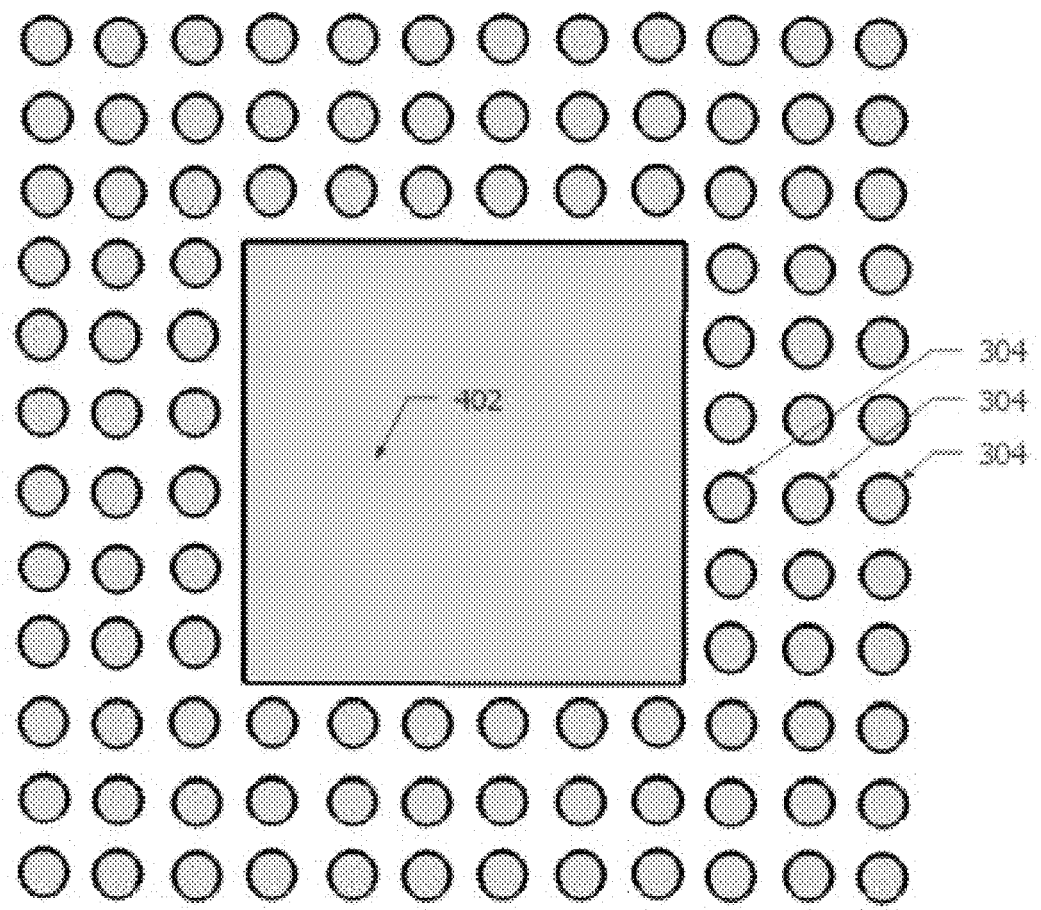
FIG. 4 illustrates a plurality of pads and an IC chip which represent a typical semiconductor under test.

FIG. 3B also illustrates various ways for securing the probes 304. Referring to FIG. 4 which illustrates a plurality of pads and an IC chip which represent a typical semiconductor under test. In FIG. 4, there are three bond pads which are situated in the horizontal direction and are to be contacted by three probes 304. Referring back to FIG. 3B, in the single embodiment or in some embodiments, the two probes 304 may be two of the three probes that are to contact their corresponding bond pads as illustrated in FIG. 4.

In the single embodiment or in some embodiments, these probes 304 may be configured or adapted to be situated on top of each other. In this single embodiment or in these embodiments, these probes 304 may be jointly, fixedly secured to the probe card by, for example, fixedly securing these probes 304 to a top surface of the upper die 306 as illustrated by 324 which represents the use of, for example, some epoxy resin to secure the stacking probes 304 altogether in some embodiments.

In the single embodiment or in some embodiments, the securing mechanism 324 may be situated along a horizontal portion of the probes to allow some cantilever motion when the probes 304 are driven to make contact with the bond pads on the semiconductor device under test. In some embodiments, the securing mechanism 324 may be situated to cover the corresponding first apertures for these stacking probes 304 to pass through the upper die 306. In these embodiments, the securing mechanism 324 allows no or minimal cantilever motion when the probes 304 are driven to engage the bond pads and allows the probes to exhibit vertical motion based at least in part on the probes' buckled form. In these embodiments, the probes do not exhibit lateral movement or motion when the probes are driven to engage the bond pads and thus reduce the undesired particle generation on the device side of the wafer.

In some other embodiments, each of the probes 304 may be separately secured by the securing mechanisms 326 and 328. In these embodiments, the securing mechanisms 326 and 328 may be situated along horizontal portions of the probes 304 to allow certain cantilever motion or movement for the probes 304 when the probes are driven to make contact with their corresponding bond pads. In some embodiments, the securing mechanisms 326 and 328 may be situated to cover the corresponding first apertures 314 on the upper die 306 to allow no or minimal cantilever motion or movement and to allow vertical motion, deflection, or movement of the probes when the probes are driven to make contact with their respective bond pads on the semiconductor device under test. In the single embodiment or in some embodiments, the apparatus further comprises a printed circuit board 302 to which the probes 304 are electrically or operatively connected for testing the semiconductor device under test.

It shall be noted that in various embodiments, the term "buckled form" is used to describe the profile of a portion of a probe along the vertical direction after the probe is finally assembled in the apparatus and refers to the fact that the probe is subject to certain compression stress at least along a section of the vertical portion of the probe when the probe is driven to make contact with its corresponding bond pad on the semiconductor device under test. Nonetheless, the use of the term "buckled" does not necessarily mean that the probe actually exhibits a failure mode as commonly understood in buckling. That is, although a portion of the probe deflects or deforms to exhibit a similar form as in the actual buckling of a structural member, the use of the term "buckled form" does not necessarily suggest that the probe is actually subject to a compressive stress at or beyond the point of failure.

Figures 5A, 5B, 5C, 5D:
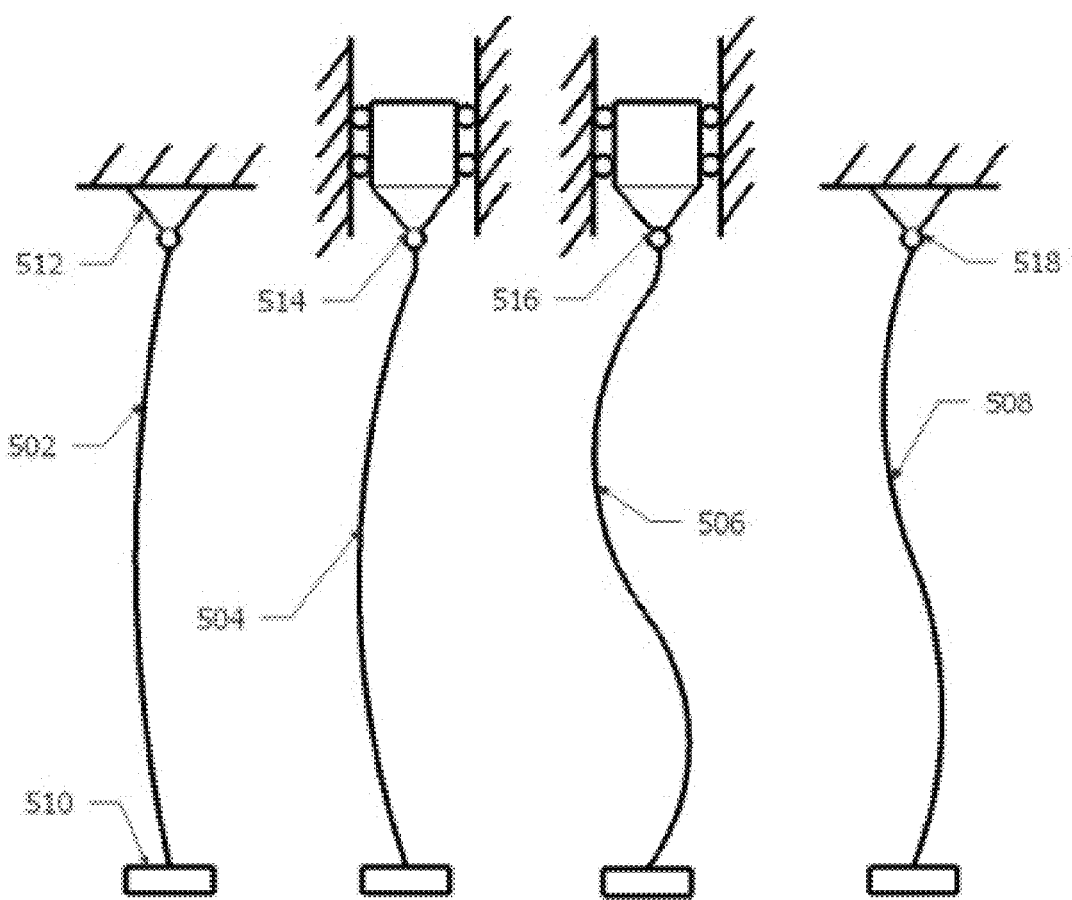
FIG. 5A-D illustrate some exemplary, simplified, and graphical representations of some buckled forms of the probes.

Referring to FIG. 5A-D which illustrate some exemplary, simplified, and graphical representations of some buckled forms of the probes. FIG. 5A illustrates a buckled form which appears to be similar to a first buckling mode of a structural member. In this representation, a vertical portion of the probe 502 has been driven to make contact with the respective bond pad 510. The securing mechanism 512 in FIG. 5A rotatably secures the vertical portion of the probe 502 and allows the vertical probe portion 502 to rotate along the axis passing through the center of rotation which is graphically represented by the center of the small circle in FIG. 5A. This configuration as illustrated in FIG. 5A is similar to the securing mechanism 324, 326, or 328 when the securing mechanism is situated along a horizontal portion of the probe without covering the first aperture(s) to allow for some cantilever motion, movement, or deflection of the probe.

FIG. 5B illustrates a buckled form which also appears to be similar to a first buckling mode of a structural member. In this representation, a vertical portion of the probe 504 has been driven to make contact with the respective bond pad. The securing mechanism 514 in FIG. 5B fixedly secures the vertical portion of the probe 504 and allows no or minimal cantilever motion, movement, or deflection of the probe 504. This configuration as illustrated in FIG. 5A is similar to the securing mechanism 324, 326, or 328 when the securing mechanism is situated to cover the first aperture(s) to allow no or minimal cantilever motion, movement, or deflection of the probe and to allow vertical movement, motion, or deflection of the probe tip so the probe tip does not scrub against its corresponding bond pad when the probe 504 is driven to make contact with its corresponding bond pad.

FIG. 5C illustrates a buckled form which also appears to be similar to a second buckling mode of a structural member. In this representation, a vertical portion of the probe 506 has been driven to make contact with the respective bond pad. The securing mechanism 516 in FIG. 5C fixedly secures the vertical portion of the probe 506 and allows no or minimal cantilever motion, movement, or deflection of the probe 506. This configuration as illustrated in FIG. 5C is similar to the securing mechanism 324, 326, or 328 when the securing mechanism is situated to cover the first aperture(s) to allow no or minimal cantilever motion, movement, or deflection of the probe and to allow vertical movement, motion, or deflection of the probe tip so the probe tip does not scrub against its corresponding bond pad when the probe 506 is driven to make contact with its corresponding bond pad.

FIG. 5D illustrates a buckled form which appears to be similar to a second buckling mode of a structural member. In this representation, a vertical portion of the probe 508 has been driven to make contact with the respective bond pad. The securing mechanism 518 in FIG. 5D rotatably secures the vertical portion of the probe 506 and allows the vertical probe portion 508 to rotate along the axis passing through the center of rotation which is graphically represented by the center of the small circle in FIG. 5D. This configuration as illustrated in FIG. 5D is similar to the securing mechanism 324, 326, or 328 when the securing mechanism is situated along a horizontal portion of the probe without covering the first aperture(s) to allow for some cantilever motion, movement, or deflection of the probe 508.

Figures 6A, 6B:
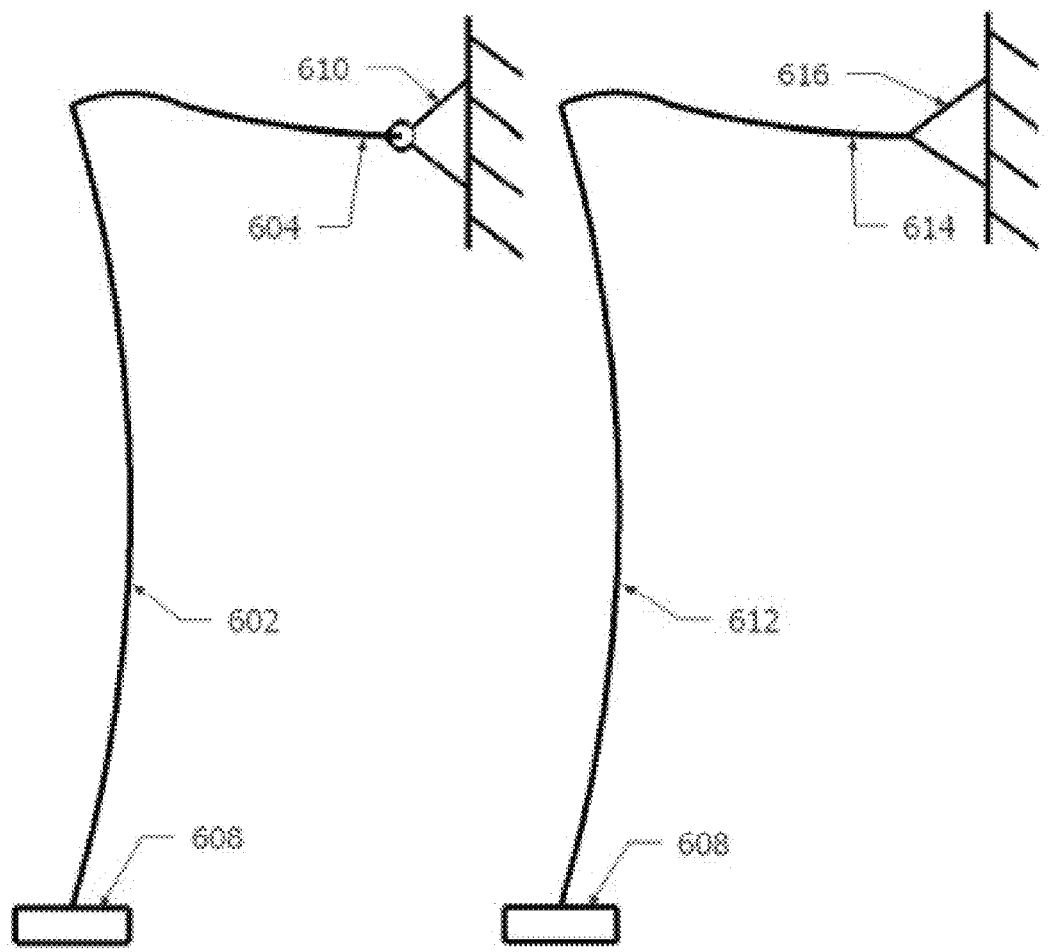
FIG. 6A-B illustrate different mounting mechanisms which allow some cantilever movement, motion, or deflection of the probe.

Referring to FIG. 6A-B which illustrates different mounting mechanisms which allow some cantilever movement, motion, or deflection of the probe. FIG. 6A illustrates a part of a cantilevered probe which comprises a vertical portion 602 and a horizontal portion 604. The probe has already made contact with its corresponding bond pad 608 and in the embodiments as illustrated in FIG. 6A, the vertical portion of the probe exhibits a buckled form that appears to be similar to the first buckling mode of a structural member.

The securing mechanism 610 rotatably secures the probe along the axis which is perpendicular to the drawing sheet and passes through the center of the small circle in FIG. 6A. In the embodiments where the probes are secured as shown in FIG. 6A, the probe tip scrubs against the top surface of its corresponding bond pad 608 when the probe is driven to make contact with the bond pad. In these embodiments, the cantilevered form of the probe and the manner the probe is secured cause the scrubbing action between the probe tip and the top surface may be used to break up the thin oxide layer which has been formed at or near the contact area on the bond pad to ensure better electrical contact.

FIG. 6B illustrates a part of a cantilevered probe which comprises a vertical portion 612 and a horizontal portion 614. The probe has already made contact with its corresponding bond pad 608 and in the embodiments as illustrated in FIG. 6B, the vertical portion of the probe exhibits a buckled form that appears to be similar to the first buckling mode of a structural member. The securing mechanism 616 fixedly secures the probe on one end of the horizontal portion 614 of the probe. The probe is thus more rigid structurally because the horizontal portion 614 is further constrained to exhibit no rotation.

In the embodiments where the probes are secured as shown in FIG. 6B, the probe tip scrubs against the top surface of its corresponding bond pad 608 when the probe is driven to make contact with the bond pad. In these embodiments, the cantilevered form of the probe and the manner the probe is secured cause the scrubbing action between the probe tip and the top surface may be used to break up the thin oxide layer which has been formed at or near the contact area on the bond pad to ensure better electrical contact.

Figures 7A, 7B:
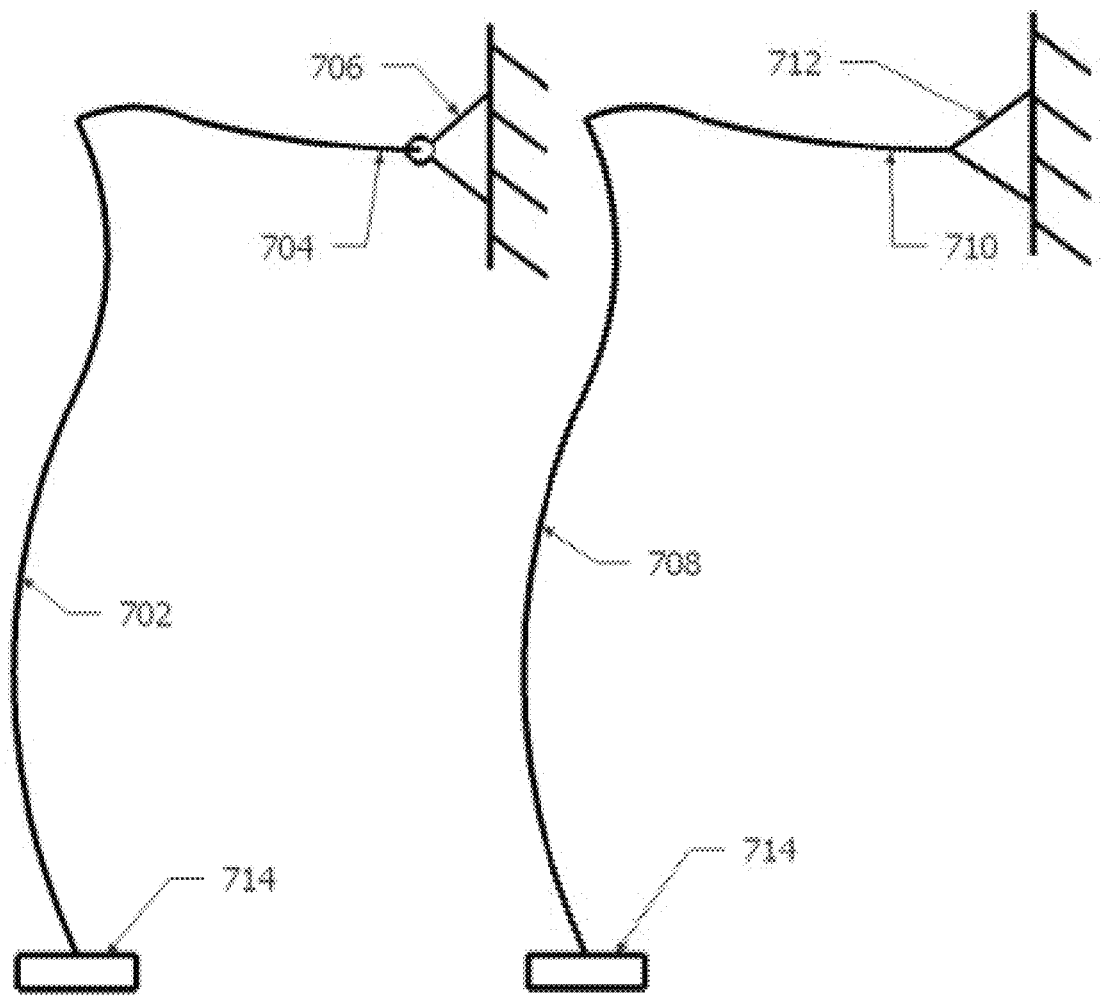
FIG. 7A-B illustrate different mounting mechanisms which allow some cantilever movement, motion, or deflection of the probe.

Referring to FIG. 7A-B which illustrate different mounting mechanisms which allow some cantilever movement, motion, or deflection of the probe. FIG. 7A illustrates a part of a cantilevered probe which comprises a vertical portion 702 and a horizontal portion 704. The probe has already made contact with its corresponding bond pad 714 and in the embodiments as illustrated in FIG. 7A, the vertical portion of the probe exhibits a buckled form that appears to be similar to the second buckling mode of a structural member.

The securing mechanism 706 rotatably secures the probe along the axis which is perpendicular to the drawing sheet and passes through the center of the small circle in FIG. 7A. In the embodiments where the probes are secured as shown in FIG. 7A, the probe tip scrubs against the top surface of its corresponding bond pad 714 when the probe is driven to make contact with the bond pad. In these embodiments, the cantilevered form of the probe and the manner the probe is secured cause the scrubbing action between the probe tip and the top surface may be used to break up the thin oxide layer which has been formed at or near the contact area on the bond pad to ensure better electrical contact.

FIG. 7B illustrates a part of a cantilevered probe which comprises a vertical portion 708 and a horizontal portion 710. The probe has already made contact with its corresponding bond pad 714 and in the embodiments as illustrated in FIG. 7A, the vertical portion of the probe exhibits a buckled form that appears to be similar to the second buckling mode of a structural member. The securing mechanism 712 fixedly secures the probe on one end of the horizontal portion 710 of the probe. The probe is thus more rigid structurally because the horizontal portion 710 is further constrained to exhibit no rotation. In the embodiments where the probes are secured as shown in FIG. 7B, the probe tip scrubs against the top surface of its corresponding bond pad 714 when the probe is driven to make contact with the bond pad. In these embodiments, the cantilevered form of the probe and the manner the probe is secured cause the scrubbing action between the probe tip and the top surface may be used to break up the thin oxide layer which has been formed at or near the contact area on the bond pad to ensure better electrical contact.

Figure 8:
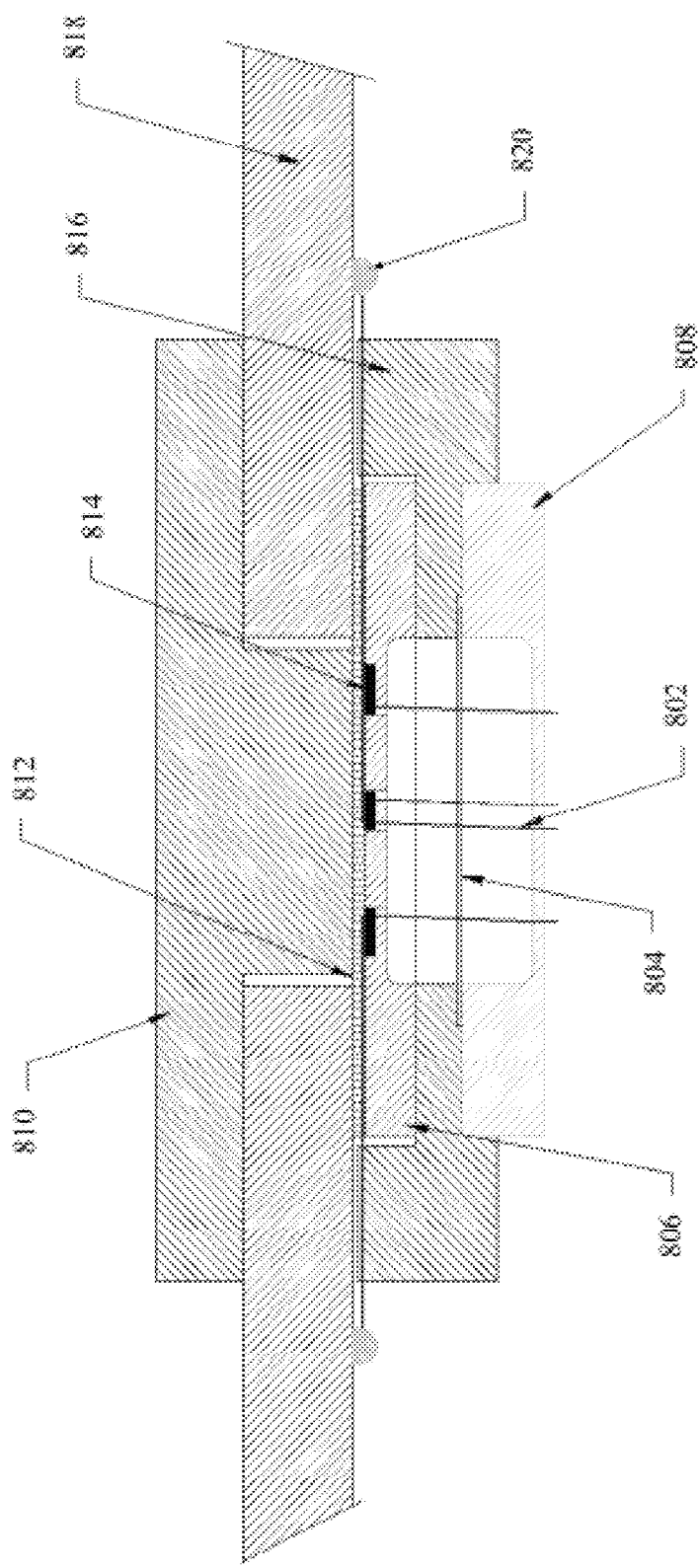
FIG. 8 illustrates an exemplary apparatus for implementing electrical connectivity for electronic circuit testing in some embodiments.

Referring to FIG. 8 which illustrates an exemplary apparatus for implementing electrical connectivity for electronic circuit testing in some embodiments. The exemplary apparatus a plurality of probes 802, a template 804 which, in some embodiments, is free floating and is supported by the probes in one or more buckled forms. The exemplary apparatus further comprises an upper guide plate or an upper die 806 which may be made of some hard ceramic such as Zirconia, Zirconium Nitride, or other hard ceramics. The upper guide plate or the upper die 806 may also be made of plastic materials.

The exemplary apparatus further comprises a lower guide plate or a lower die 808 which may be made of some hard ceramic such as Zirconia, Zirconium Nitride, other hard ceramics, or some plastic materials. The exemplary apparatus may further comprise a printed circuit board 818 which transmits and receives signals to and from the semiconductor device under test through the probes 802.

The probes 802 may be electrically or operatively connected to the printed circuit board 818 by, for example, the use of some wire solder 820. The exemplary apparatus may further comprise some probe securing mechanism 814 which is used to secure the probes 802 to the upper guide plate or the upper die 806 in some embodiments. In one embodiment, the probe securing mechanism 814 comprises some epoxy resin or other similar adhesives.

In some embodiments, the exemplary apparatus may further comprise a stiffener 810 which helps to improve the structural integrity and robustness of the exemplary apparatus or helps to secure the printed circuit board 818 in the exemplary apparatus. In some embodiments, the exemplary apparatus may further comprise a sheet or plate member 812.

In some embodiment, the sheet or plate member 812 is configured or adapted to insulate or protect various portions of the probes from the printed circuit board. For example, in some embodiments where bare, uninsulated probes are used, the sheet or plate member 812 may be used to insulate some horizontal portions of the probes from one or more electronic components on the printed circuit board 818. In one embodiment, the sheet or plate member 812 may be made of an elastomeric material such as Viton®, polyimide materials, or other materials which may be used for insulation purposes, for preventing cross-talk noise, or for other purposes. In some embodiments, the exemplary apparatus may further comprise a spacer 816 which defines a recessed area to constrain the movement or motion of the template 804. In some embodiments, the spacer 816 may be made a part of the upper guide plate or the upper die 806. In some other embodiments, the spacer 816 may be made a part of the lower guide plate or the lower die 808.

Figure 9:
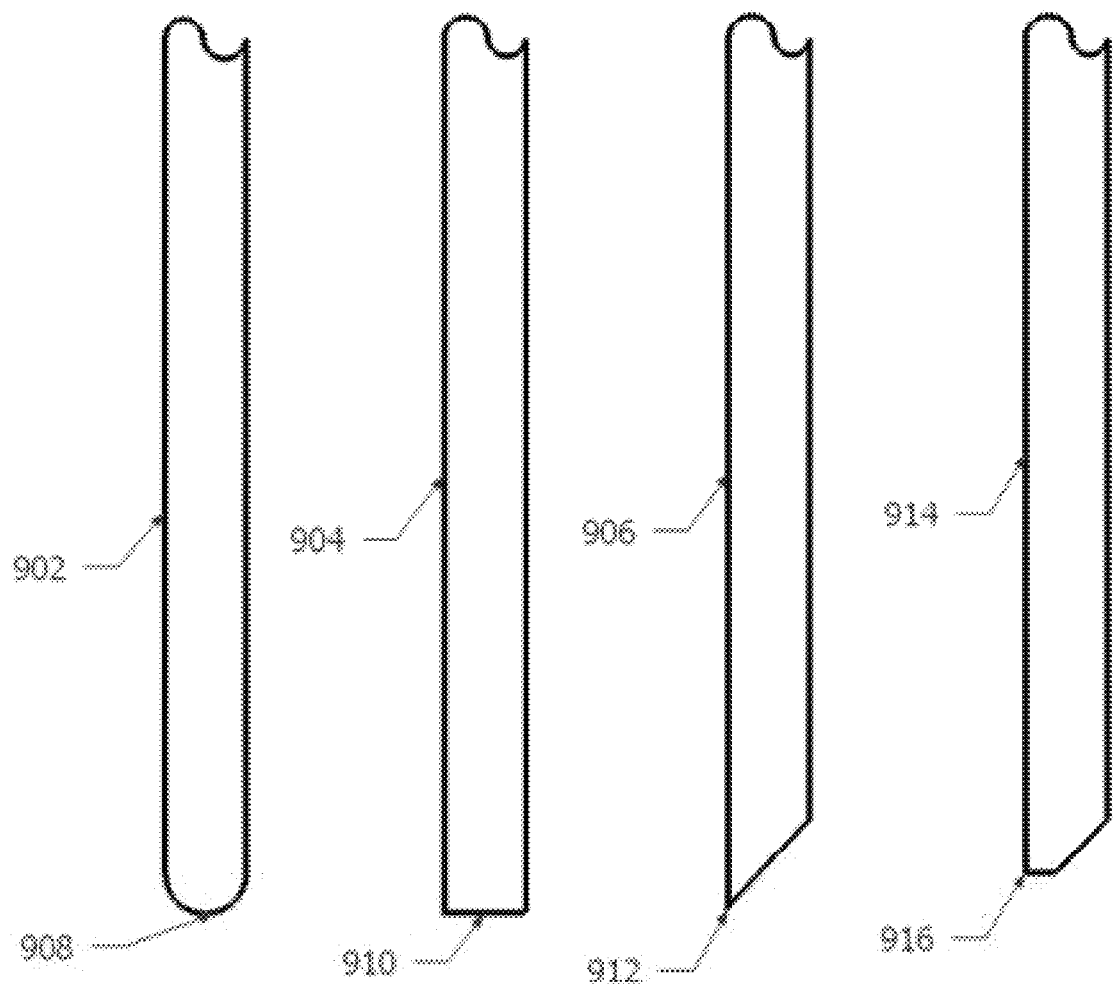
FIG. 9 illustrates some configuration of the probes.
Figure 10:
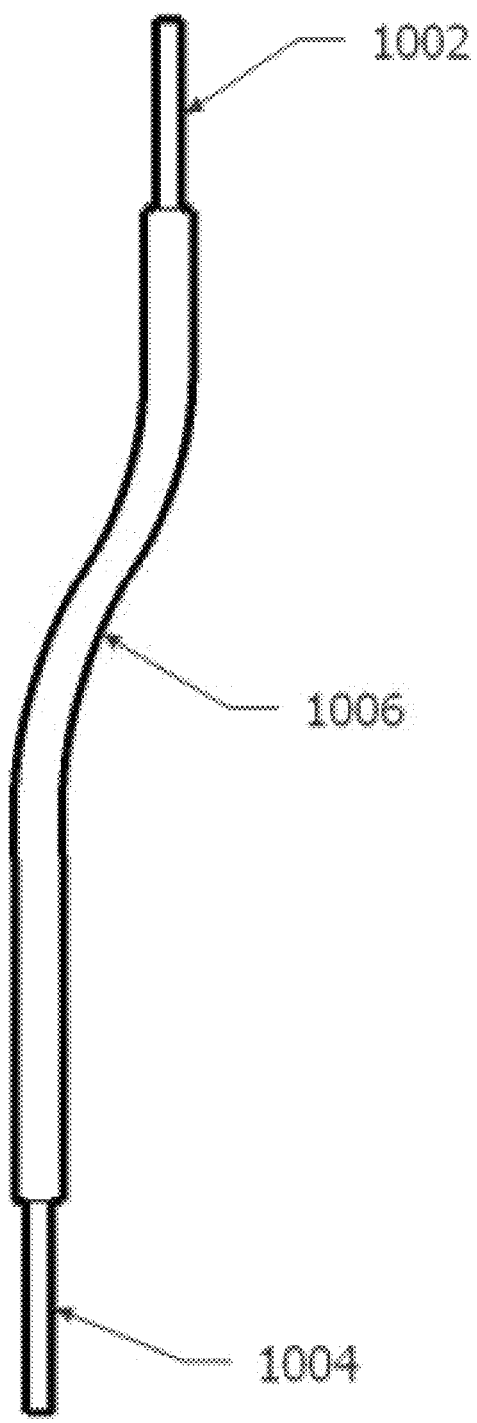
FIG. 10 illustrates a typical multi-segment probe design in which the ends of the probe are made of smaller size components or materials than the main body of the probe.

Referring to FIG. 9 which illustrates some configuration of the probes. A probe may comprise a vertical portion 902 with a domed or spherical tip 908 in some embodiments. A probe may comprise a vertical portion 904 with a flat probe tip 910. A probe may comprise a vertical portion 906 with a wedged tip 912. A probe may also comprise a vertical portion 914 with a wedged tip a portion of which is removed as shown in 916. The probes with a domed or spherical tip 908, with a wedged tip 912, or with the modified wedge tip 916 may be used to break through the oxide layer on or near the contact area on the bond pads if it is needed in some embodiments.

In the single embodiment or in some embodiments, the apparatus for implementing electrical connectivity for electronic circuit testing may comprises one or more probes which are made of extruded metal or metallic wires. In the single embodiment or in some embodiments, the extruded metal or metallic wires comprise a nominal diameter of one to two micro meters. In the single embodiment or in some embodiments, the extruded wires may comprise a larger nominal diameter ranging from two micro meters to 100 micro meters.

In the single embodiment or in some embodiments, the probes may be made of tungsten or tungsten alloys such as the uranium tungsten alloy. In the single embodiment or in some embodiments, the probes may also be made of other metal or metallic materials. In the single embodiment or in some embodiments, the probes may be made from multiple segments of metal or metallic sub-components such as metal or metallic wires or components of different sizes between the probe tip and the end of the probe that is connected to the printed circuit board.

In the single embodiment or in some embodiments, the probes may be made a single piece of extruded wire or component with the same size. For example, a probe may be made from a single piece of extruded wire from the tip of the probe to the end where the probe is connected to the printed circuit board. In these embodiments, the manufacturing of the probes is greatly simplified because it only involves simple manufacturing steps such as cutting, bending, sanding, and/or grinding of a small diameter extruded wire. Furthermore, the cost of the probe is greatly reduced in these embodiments because of the use of a single, extruded wire which is readily available and is more manufacturable than a probe with multiple, differently sized components.

In the single embodiment or in some embodiments, the probe is designed in such a way that the compressive stress on the tip is equal to or more than the yield strength of the material to ensure sufficiently good contact between the probe and its corresponding bond pad on the semiconductor device under test. In this single embodiment or in these embodiments, the material, geometric configuration which comprises the size and the buckled form of the probe, and/or the tip of the probe, and the overdrive and the manner in which the probes are engaged with their corresponding bond pads may be properly considered to ensure good electrical contact between the probes and their corresponding bond pads. This is especially important for testing which requires higher current to the semiconductor device under test because the higher current will inevitable causes more Ohm heating if the electrical contact resistance is not properly managed. This is especially important for testing semiconductor device under test with very high pad density because such a semiconductor device under test usually requires probes with small geometries, such as a few microns in diameter, and thus inevitably increases the resistance of the probe and hence the Ohm heating when the testing runs current through such higher resistance probes. Lower electrical contact resistance will reduce the amount of Ohm heating and thus protect not only the probes but also the semiconductor devices under test.

Some embodiments are directed to a method for implementing electrical connectivity for electronic circuit testing by using the apparatus as disclosed above.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The aforementioned embodiments are described for the ease of illustration and explanation but do not intend to and shall not be construed to limit the scope of various embodiments. Modification and substitution may also be made by one of ordinary skill in the art without departing from the spirit or scope of the invention, which should still be deemed to be within the scope as set forth by the claims. Other aspects and features of the invention will be evident from reading the following detailed description of the preferred embodiments, which are intended to illustrate, not limit, the invention. Although particular embodiments of the present inventions have been shown and described, it will be understood that it is not intended to limit the present inventions to the preferred embodiments, and it will be obvious to those skilled in the art that various changes and modifications may be made without departing from the spirit and scope of the present inventions. The specification and drawings are, accordingly, to be regarded in an illustrative rather than restrictive sense. Various embodiments are intended to cover alternatives, modifications, and equivalents, which may be included within the spirit and scope of the present inventions as defined by the claims.

The invention claimed is:

1. An apparatus for implementing electrical connectivity for testing of a semiconductor device, comprising:
   a probe head which comprises an upper guide plate and a lower guide plate, wherein
      the upper guide plate defines a plurality of first apertures, and
      the lower guide plate defines a plurality of second apertures; and
   a plurality of probes, wherein
      each of the plurality of probes passes through one of the plurality of first apertures on the upper guide plate and one of the plurality of second apertures on the lower guide plate, and
      at least one of the plurality of probes defines a buckled form after the at least one of the plurality of probes is finally assembled in the apparatus; and
      wherein a portion of at least one of the plurality of probes is fixedly or rotatably secured to the upper guide plate to allow the at least one of the plurality of probes to exhibit vertical movement, deflection, or motion when the at least one of the plurality of probes is driven to make contact with a corresponding bond pad on the semiconductor device without exhibiting lateral motion or movement so that a tip of the at least one of the plurality of probes scrubs against the corresponding bond pad.

2. The apparatus of claim 1, wherein the apparatus comprises:
   a printed circuit board which interfaces between an electronic circuit test equipment and the semiconductor device, wherein
   at least one of the plurality of probes are electrically connected to the printed circuit board on one end.

3. The apparatus of claim 2, wherein the at least one of the plurality of probes comprises:
   a probe tip which contacts a corresponding bond pad during the testing of the semiconductor device, and
   the at least one of the plurality of probes comprises a single piece component with a uniform nominal cross-section geometry.

4. The apparatus of claim 2, wherein the at least one of the plurality of probes comprises a plurality of segments with more than one nominal cross-section geometry.

5. The apparatus of claim 1, further comprising:
   a template member which defines a plurality of third apertures for the plurality of probes to pass through.

6. The apparatus of claim 5, wherein a body of the template member comprises a transparent or translucent part.

7. The apparatus of claim 5, wherein the template member is floating between the upper guide plate and the lower guide plate without being secured to any component in the apparatus.

8. The apparatus of claim 1, wherein at least two adjacent probes of the plurality of probes are not electrically insulated from each other.

9. The apparatus of claim 1, wherein either the upper guide plate or the lower guide plate is made of hard ceramic material.

10. The apparatus of claim 1, wherein a body of at least one of the plurality of probes is made of a tungsten alloy.

11. The apparatus of claim 1, wherein the apparatus further comprises a securing mechanism which fixedly or rotatably secures the at least one of the plurality of probes by covering a corresponding aperture of the plurality of first apertures on the upper guide plate to allow the at least one of the plurality of probes to exhibit the vertical movement, deflection, or motion.

12. The apparatus of claim 1, wherein the buckled form is a second buckling mode of a structural member.

13. The apparatus of claim 1, where the lower guide plate is offset to aid creation of the buckled form.

14. An apparatus for implementing electrical connectivity for testing of a semiconductor device, comprising:
   a probe head which comprises an upper guide plate and a lower guide plate, wherein
      the upper guide plate defines a plurality of first apertures, and
      the lower guide plate defines a plurality of second apertures; and
   a plurality of probes, wherein
      each of the plurality of probes passes through one of the plurality of first apertures on the upper guide plate and one of the plurality of second apertures on the lower guide plate, and
      at least one of the plurality of probes defines a buckled form after the at least one of the plurality of probes is finally assembled in the apparatus; and
      wherein a portion of at least one of the plurality of probes is fixedly or rotatably secured to the upper guide plate to allow the at least one of the plurality of probes to exhibit cantilevered movement, deflection, or motion when the at least one of the plurality of probes is driven to make contact with a corresponding bond pad on the semiconductor device.

15. The apparatus of claim 14, wherein the apparatus further comprises a second securing mechanism which fixedly or rotatably secures the at least one of the plurality of probes by exposing a second corresponding aperture of the plurality of first apertures on the upper guide plate to allow the at least one of the plurality of probes to exhibit the cantilevered movement, deflection, or motion.

16. The apparatus of claim 14, wherein the apparatus comprises:
   a printed circuit board which interfaces between an electronic circuit test equipment and the semiconductor device, wherein
   at least one of the plurality of probes are electrically connected to the printed circuit board on one end.

17. The apparatus of claim 14, further comprising:
   a template member which defines a plurality of third apertures for the plurality of probes to pass through.

18. The apparatus of claim 14, wherein at least two adjacent probes of the plurality of probes are not electrically insulated from each other.

19. The apparatus of claim 14, wherein either the upper guide plate or the lower guide plate is made of hard ceramic material.

20. The apparatus of claim 14, wherein a body of at least one of the plurality of probes is made of a tungsten alloy.

21. The apparatus of claim 14, wherein the buckled form is a second buckling mode of a structural member.

22. The apparatus of claim 14, where the lower guide plate is offset to aid creation of the buckled form.

23. An apparatus for implementing electrical connectivity for testing of a semiconductor device, comprising:
- a probe head which comprises an upper guide plate and a lower guide plate, wherein
    - the upper guide plate defines a plurality of first apertures, and
    - the lower guide plate defines a plurality of second apertures;
- a plurality of probes, wherein
    - each of the plurality of probes passes through one of the plurality of first apertures on the upper guide plate and one of the plurality of second apertures on the lower guide plate, and
    - at least one of the plurality of probes defines a buckled form after the at least one of the plurality of probes is finally assembled in the apparatus; and
    - wherein a first probe of the plurality of probes stacks on top of a second probe of the plurality of probes, and both the first probe and the second probe are fixedly or rotatably secured by using a single securing mechanism which allows the first probe and the second probe to exhibit vertical but not cantilevered motion, movement, or deflection or cantilevered motion, movement, or deflection.

24. The apparatus of claim 23, wherein the apparatus comprises:
- a printed circuit board which interfaces between an electronic circuit test equipment and the semiconductor device, wherein
- at least one of the plurality of probes are electrically connected to the printed circuit board on one end.

25. The apparatus of claim 23, further comprising:
- a template member which defines a plurality of third apertures for the plurality of probes to pass through.

26. The apparatus of claim 23, wherein at least two adjacent probes of the plurality of probes are not electrically insulated from each other.

27. The apparatus of claim 23, wherein either the upper guide plate or the lower guide plate is made of hard ceramic material.

28. The apparatus of claim 23, wherein a body of at least one of the plurality of probes is made of a tungsten alloy.

29. The apparatus of claim 23, wherein the buckled form is a second buckling mode of a structural member.

30. The apparatus of claim 23, where the lower guide plate is offset to aid creation of the buckled form.

* * * * *